(12) United States Patent
Toumiya et al.

(10) Patent No.: US 8,884,392 B2
(45) Date of Patent: Nov. 11, 2014

(54) METHOD OF MANUFACTURING SOLID STATE IMAGING DEVICE, AND SOLID STATE IMAGING DEVICE

(71) Applicant: Sony Corporation, Tokyo (JP)

(72) Inventors: Yoshinori Toumiya, Kanagawa (JP); Ina Hori, Kumamoto (JP); Tadayuki Dofuku, Kumamoto (JP); Hitomi Kamiya, Kanagawa (JP); Atsushi Yamamoto, Kumamoto (JP); Taichi Natori, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 14/087,737

(22) Filed: Nov. 22, 2013

(65) Prior Publication Data

US 2014/0084406 A1    Mar. 27, 2014

Related U.S. Application Data

(62) Division of application No. 12/792,355, filed on Jun. 2, 2010, now Pat. No. 8,603,852.

(30) Foreign Application Priority Data

Jun. 17, 2009 (JP) .................................. 2009-144572

(51) Int. Cl.
*H01L 31/0232* (2014.01)
*H01L 27/146* (2006.01)
*H01L 27/148* (2006.01)

(52) U.S. Cl.
CPC ......... *H01L 27/14627* (2013.01); *H01L 27/148* (2013.01); *H01L 27/14643* (2013.01); *H01L 27/14685* (2013.01); *H01L 27/14636* (2013.01)
USPC ............... 257/437; 257/432; 257/E31.127; 438/68; 438/69; 438/72

(58) Field of Classification Search
None
See application file for complete search history.

(56) References Cited

U.S. PATENT DOCUMENTS

| 7,166,537 B2 * | 1/2007 | Jacobsen et al. | 438/720 |
| 2001/0010952 A1 * | 8/2001 | Abramovich | 438/151 |
| 2007/0215204 A1 * | 9/2007 | Maehara | 136/256 |

* cited by examiner

*Primary Examiner* — Johannes P Mondt
(74) *Attorney, Agent, or Firm* — Sheridan Ross P.C.

(57) ABSTRACT

Disclosed herein is a method of manufacturing a solid state imaging device, including the steps of: forming a light receiving portion in a light receiving area of a semiconductor substrate; forming a pad portion in a pad area of the semiconductor substrate; forming a microlens material layer over the light receiving portion and the pad portion; providing the microlens material layer with a microlens corresponding to the light receiving portion; forming a low-reflection material layer on the microlens material layer; etching the microlens material layer and the low-reflection material layer over the pad portion to form an opening; and imparting hydrophilicity to a surface of the low-reflection material layer and an inside portion of the opening by a normal temperature oxygen radical treatment.

6 Claims, 4 Drawing Sheets

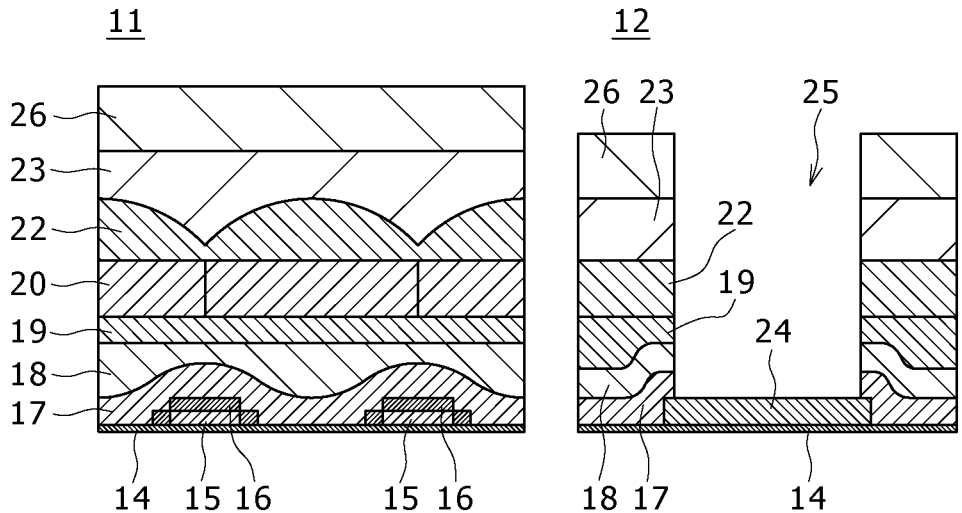
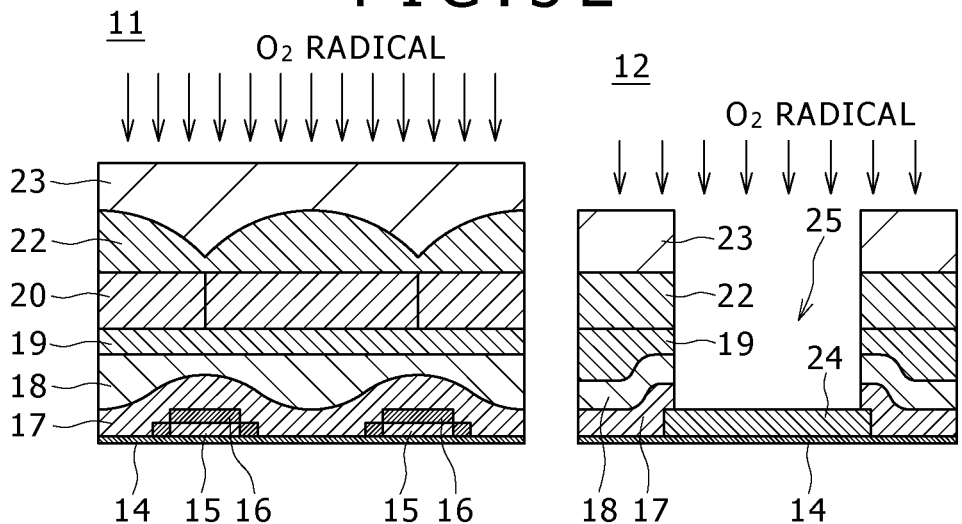
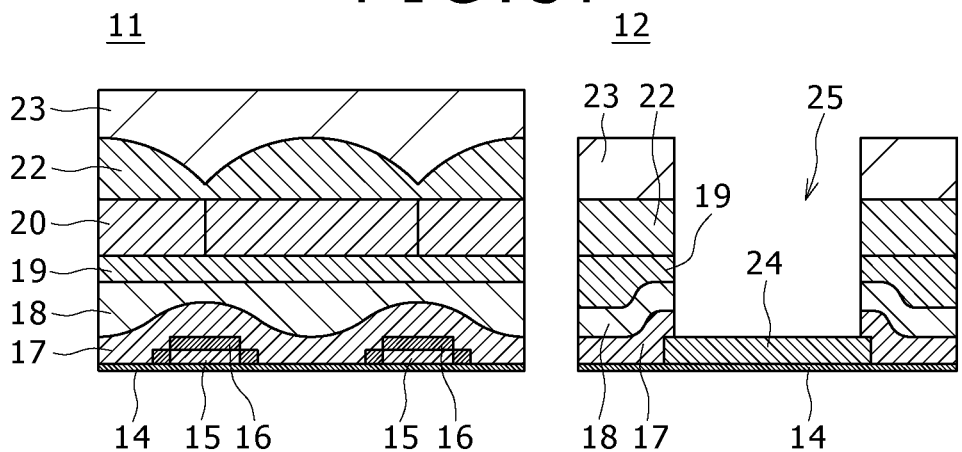

METHOD OF MANUFACTURING SOLID STATE IMAGING DEVICE, AND SOLID STATE IMAGING DEVICE

CROSS-REFERENCE TO RELATES APPLICATIONS

This application is a divisional of U.S. patent application Ser. No. 12/792,355, filed Jun. 2, 2010, which claims priority to Japanese Patent Application Serial No. JP 2009-144572, filed in the Japan Patent Office on Jun. 27, 2009, the entire disclosures of which are hereby incorporated herein by reference.

BACKGROUND OF THE INVENTION

1. Field of the Invention

The present invention relates to a method of manufacturing a solid state imaging device having microlenses over pixels, and a solid state imaging device having microlenses.

2. Description of the Related Art

In order to prevent cutting chips generated during wafer dicing from being deposited on an image sensor, the cutting chips are washed out from the wafer by use of a large amount of pure water. If a dry area is generated on the wafer during this washing operation, the cutting chips may be deposited on the dry area, hampering cleaning of the wafer. For avoiding generation of such a dry area, the wafer surface to be cleaned is made hydrophilic by an oxygen plasma treatment (refer to, for example, Japanese Patent Laid-open No. Hei 5-335412).

SUMMARY OF THE INVENTION

In the oxygen plasma treatment according to the related art, however, resin materials such as a microlens material and a planarizing material would be damaged with the result of a lowering in film thickness or recession of the resin materials at side walls of openings. For instance, at the side walls of openings formed for pad connection, the microlens material layer may recede by 100 nm or more due to the damage to the resin materials.

Thus, the shape change of the microlens material layer arising from the hydrophilic treatment constitutes a problem to be solved.

Accordingly, there is a desire for a method of manufacturing a solid state imaging device with which it is possible to suppress the shape change due to damage of a microlens material layer and the like, and a solid state imaging device free of the shape change problem.

According to an embodiment of the present invention, there is provided a method of manufacturing a solid state imaging device, including the steps of forming a light receiving portion in a light receiving area of a semiconductor substrate, and forming a pad portion in a pad area of the semiconductor substrate. The method also includes the steps of forming a microlens material layer over the light receiving portion and the pad portion, providing the microlens material layer with a microlens corresponding to the light receiving portion, and forming a low-reflection material layer on the microlens material layer. Further, the method includes the steps of etching the microlens material layer and the low-reflection material layer over the microlens material layer to form an opening, and imparting hydrophilicity to a surface of the low-reflection material layer and to an inside portion of the opening by a normal temperature oxygen radical treatment.

According to another embodiment of the present invention, there is provided a method of manufacturing a solid state imaging device, including the steps of imparting hydrophilicity to a surface of a semiconductor substrate, and dicing the semiconductor substrate after the hydrophilicity-imparting step.

According to a further embodiment of the present invention, there is provided a solid state imaging device which includes a semiconductor substrate, a light receiving portion formed in the semiconductor substrate, a pad portion formed over the semiconductor substrate, and a microlens material layer formed over the light receiving portion and the pad portion. The solid state imaging device also includes a low-reflection material layer which is formed on the microlens material layer and a surface of which is treated to be hydrophilic, and an opening formed in the microlens material layer and the low-reflection material layer on the upper side of the pad portion. In the solid state imaging device, side walls of the opening are treated to be hydrophilic, and the microlens material layer exposed from the side walls of the opening does not show recession relative to the low-reflection material layer.

According to yet another embodiment of the present invention, there is provided an electronic apparatus which includes the above-mentioned solid state imaging device, an optical system operable to guide incident light to an imaging portion of the solid state imaging device, and a signal processing circuit operable to process an output signal from the solid state imaging device.

In accordance with the method of manufacturing a solid state imaging device pertaining to an embodiment of the present invention, the surface of the wafer and the surface of the low-reflection material layer as well as the side walls of the opening on the upper side of the pad portion can be made hydrophilic by the normal temperature oxygen radical treatment. In this case, by using the normal temperature oxygen radical treatment as a hydrophilic treatment, the desired surfaces can be made hydrophilic while maintaining the shapes of the microlens material layer and the like, which would undergo a considerable shape change if subjected, for example, to an oxygen plasma treatment according to the related art.

In addition, according to the solid state imaging device pertaining to another embodiment of the present invention, the surface of the low-reflection material layer and the side walls of an opening on the upper side of the pad portion are made hydrophilic by a normal temperature oxygen radical treatment. With the desired surfaces made hydrophilic by the normal temperature oxygen radical treatment, it is possible to suppress shape change of the microlens material layer exposed at the side walls of the opening, the shape change being, for example, recession toward the inside of the side walls due to the etching.

Thus, according to embodiments of the present invention, a solid state imaging device can be configured while suppressing shape change due to damage of a microlens material layer and the like arising from a hydrophilic treatment.

BRIEF DESCRIPTION OF THE DRAWINGS

FIGS. 3A to 3F show manufacturing step diagrams of the solid state imaging device according to an embodiment of the present invention;

DETAILED DESCRIPTION OF THE PREFERRED EMBODIMENTS

Now, examples of the best mode of carrying out the present invention will be described below, but the invention is not to be limited to the examples.

Incidentally, the description will be made in the following order.
1. Description of an embodiment of the solid state imaging device
2. An embodiment of the method of manufacturing a solid state imaging device
3. An electronic apparatus configured by application of the solid state imaging device of the embodiment <1. Description of an Embodiment of the Solid State Imaging Device>

[Plan View]

Figure 1:
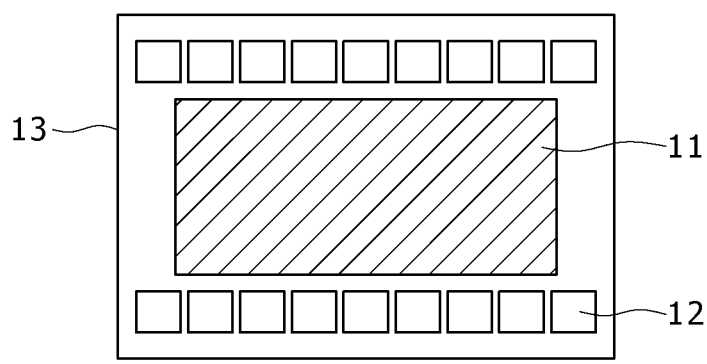
FIG. 1 is a block diagram of a solid state imaging device according to an embodiment of the present invention.

FIG. 1 shows a block diagram of a CCD (Charge Coupled Device) solid state imaging device as an example of the solid state imaging device.

The CCD solid state imaging device 10 shown in FIG. 1 includes a light receiving area 11 and a bonding pad area 12 formed in a semiconductor substrate 13.

The light receiving area 11 in the CCD solid state imaging device of an interline transfer (hereinafter abridged to IT) system, for example, has a plurality of light receiving portions arranged in a two-dimensional matrix. In addition, an imaging area in which vertical transfer registers of a CCD structure are arrayed so that each of them corresponds to each column of the light receiving portions has a horizontal transfer register of a CCD structure. Further, an output unit including a charge-voltage conversion section is connected to a final stage of the horizontal transfer register. The output unit is composed, for example, of a so-called floating diffusion amplifier which includes a floating diffusion (FD) and a source follower amplifier. The output unit may also be composed of a so-called floating gate amplifier.

In the light receiving portion, a signal charge according to the amount of light received is generated, and is stored. With a read-out gate voltage VT impressed on a read-out gate portion, the signal charge in the light receiving portion is read out into the vertical transfer register. After thus being read out into the vertical transfer registers, the signal charges are sequentially transferred through the vertical transfer registers toward the horizontal transfer register on a line-by-line basis, by a vertical driving pulse impressed on a vertical transfer electrode. After the signal charges are transferred from the vertical transfer registers into the horizontal transfer register on a line-by-line basis, the signal charges are sequentially transferred through the horizontal transfer register, to be outputted as pixel signals (image pick-up signal) via the output unit. Specifically, the signal charges transferred from the horizontal transfer register into the floating diffusion (FD) are converted by the source follower circuit into signal voltages, or the pixel signals, which are outputted.

Besides, in the CCD solid state imaging apparatus of a frame interline transfer (hereinafter abridged to FIT) system, for example, a plurality of light receiving portions are arranged in a two-dimensional matrix. In addition, an imaging area in which vertical transfer registers are arrayed so that each of them corresponds to each column of the light receiving portions, a storage area, and a horizontal transfer register, are provided. The vertical transfer registers and the horizontal transfer register are each configured to have a CCD structure. The storage area is composed of CCD-structure vertical transfer registers the number of which corresponds to the vertical transfer registers in the imaging area. Further, an output unit including a charge-voltage conversion section equivalent to the above-mentioned is connected to a final stage of the horizontal transfer register.

In the CCD solid state imaging apparatus of the FIT system, a signal charge according to the amount of light received is generated and stored in the light receiving portion. With a read-out gate voltage VT impressed on a read-out gate portion, the signal charge in the light receiving portion is read out into the vertical transfer register. After the signal charges are read out into the vertical transfer registers, a high-speed-transfer vertical driving pulse is impressed on vertical transfer electrodes of the vertical transfer registers in the imaging area and vertical transfer electrodes of the vertical transfer registers in the storage area. As a result, the signal charges read out into the vertical transfer registers in the imaging area are transferred at high speed into and stored in the vertical transfer registers in the storage region. Thereafter, with a fixed-speed vertical driving pulse impressed on the vertical transfer registers in the storage region, the signal charges are sequentially transferred through the vertical transfer registers toward the horizontal transfer register on a line-by-line basis. Then, the signal charges on the line-by-line basis are transferred from the vertical transfer registers to the horizontal transfer register. Thereafter, with a horizontal driving pulse impressed on the horizontal transfer electrode, the signal charges are sequentially transferred through the horizontal transfer register, to be outputted as pixel signals (image pick-up signal) via an output unit.

The bonding pad area 12 is provided in the vicinity of the light receiving area 11. For connection of the solid state imaging device 10 by wire bonding or the like, the bonding pad area 12 has bonding pad portions (pad portions) formed of aluminum or the like, and openings provided on the upper side of the pad portions. The openings on the upper side of the pad portions are formed, for example, by forming openings in a plurality of layers including a dielectric layer on the pad portions, a passivation layer, an organic material layer, and the like.

[Sectional View]

Figure 2:
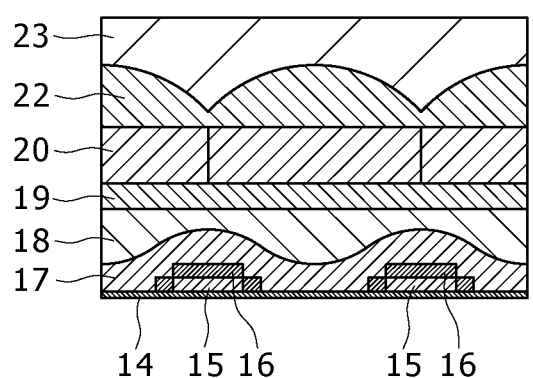
FIG. 2 shows sectional views of a light receiving area and a pad area of the solid state imaging device according to an embodiment of the present invention.
Figure 2:
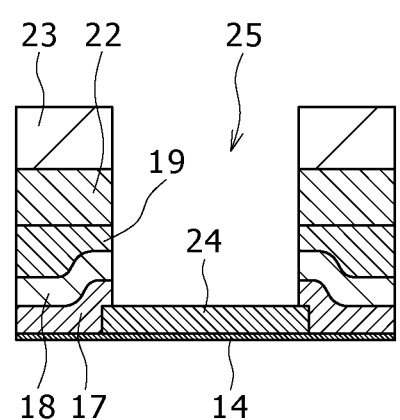

Now, sectional views of the CCD solid state imaging device are shown in FIG. 2. FIG. 2 shows a sectional view of the CCD solid state imaging device in the light receiving area 11, and a sectional view of the same in the pad area 12. Incidentally, the light receiving area 11 is shown while omitting the configurations of the light receiving portions, transfer channels and the like formed in the semiconductor substrate. Besides, in the pad area 12, only the configuration of the pad portion and the vicinity thereof is shown, while omitting the other configurations.

In the light receiving area 11, transfer electrodes 15 are formed on an insulating layer 14. In addition, a light-blocking film 16 covering the transfer electrodes 15 is formed. Besides, an interlayer dielectric layer 17 is formed covering the insulating layer 14, the transfer electrodes 15 and the light-blocking film 16.

A passivation layer 18 is formed on the interlayer dielectric layer 17. Further, a planarizing layer 19 for planarization is formed on the passivation layer 18.

Color filters 20 are formed on the planarizing layer 19. In addition, a microlens material layer 22 is formed on the color filters 20. In the light receiving area 11, the microlens material layer 22 is processed into the shape of microlenses, to form on-chip microlenses. Besides, a low-reflection material layer 23 is formed as an antireflection layer on the microlens material layer 22.

In the pad area 12, bonding pad portions (pad portions) 24 composed, for example, of aluminum electrodes are provided on the insulating layer 14.

In addition, the interlayer dielectric layer 17 is formed covering part of the pad portions 24 and the insulating layer 14. The passivation layer 18 and the planarizing layer 19 for planarization are provided over the interlayer dielectric layer 17.

The microlens material layer 22, which is a layer for forming the microlenses in the light receiving area, is formed on the planarizing layer 19. Further, the low-reflection material layer 23 is formed as an antireflection layer on the microlens material layer 22.

Besides, openings 25 formed by boring the interlayer dielectric layer 17, the passivation layer 18, the planarizing layer 19, the microlens material layer 22 and the low-reflection material layer 23 are provided on the upper side of the pad portions 24. Opening sections of the interlayer dielectric layer 17, the passivation layer 18, the planarizing layer 19, the microlens material layer 22 and the low-reflection material layer 23 formed over the pad portions 24 are exposed from side walls of the openings 25.

In the solid state imaging device as above, a surface of the low-reflection material layer 23 has been made hydrophilic by a hydrophilic treatment. In addition, in the pad area 12, the side walls of the openings 25 on the upper side of the pad portions 24 have also been subjected to a hydrophilic treatment; thus, the surface of the low-reflectance material layer 23 and the side walls of the openings 25 have been made hydrophilic.

Further, it is preferable that the upper surface of the microlens material layer 22, namely, the surface on which to form the low-reflectance material layer 23 has been made hydrophilic by a hydrophilic treatment.

The surface of the low-reflectance material layer 23, the side walls of the openings 25 and the upper surface of the microlens material layer 22 are made hydrophilic by a normal temperature oxygen radical treatment. The normal temperature oxygen radical treatment will be detailed later in the description of the method of manufacturing a solid state imaging device.

With the surface of the low-reflectance material layer 23 and the side walls of the openings 25 thus made hydrophilic, it is possible to suppress deposition onto the image sensor of cutting chips generated during wafer dicing.

In addition, with the hydrophilic treatment carried out by means of the normal temperature oxygen radical treatment, there is little possibility of damages to the layers which are formed by use of organic material or resin material and which are exposed at the side walls of the openings 25 on the upper side of the pad portions 24, such as the microlens material layer 22, the planarizing layer 19 and the passivation layer 18. Therefore, the layers formed of organic material or resin material would not recede from the side walls of the openings 25. Consequently, overhanging of the low-reflection material layer 23 at the upper side of the openings 25 can be prevented from occurring, and exfoliation of the low-reflection material layer 23 during assembly steps, for example, at the time of a BGR (Blue Green Red) tape peeling step can be prevented from occurring.

Further, since the microlens material layer 22, the planarizing layer 19 and the passivation layer 18 have not receded inside the openings 25, deposition of cutting chips in locations under overhang portions of the low-reflection material layer 23 inside the openings 25 can be suppressed.

Besides, with the upper surface of the microlens material layer 22 treated to be hydrophilic, the wettability of the surface with a solution at the time of forming the low-reflection material layer 23 by use of a solution method, for example, spin coating, is enhanced. Further, with the hydrophilic treatment carried out by the normal temperature oxygen radical treatment, loss of the organic material constituting the microlens material layer 22 can be restrained. Specifically, where the hydrophilic treatment is carried out by the normal temperature oxygen radical treatment, it is possible to restrain both a reduction in the thickness of the microlens material layer and a shape change of the microlenses, which have been experienced in the case of carrying out the hydrophilic treatment by an oxygen plasma treatment according to the related art.

Therefore, in the solid state imaging device as above, the microlenses formed from the microlens material layer 22 in the light receiving area 11 can be configured while restraining the shape change which might arise from the hydrophilic treatment. Accordingly, a solid state imaging device having microlenses treated to be hydrophilic can be configured without spoiling device characteristics, such as sensitivity, shading and smear characteristics.

<2. An Embodiment of the Method of Manufacturing a Solid State Imaging Device>

Now, an embodiment of the method of manufacturing a solid state imaging device pertaining to the present invention will be described below referring to the drawings. The following manufacturing step diagrams are sectional views of a CCD solid state imaging device in the light receiving area, and sectional views of the same in the pad area. Besides, in the following manufacturing step diagrams and the description of the manufacturing method by use of the manufacturing step diagrams, in the light receiving area, the configuration of the layers over an insulating layer and transfer electrodes formed over a semiconductor substrate is shown, while omitting the configuration of light receiving portions, transfer channels and the like formed in the semiconductor substrate. In the pad area, the configuration of a pad portion and the vicinity thereof is shown, while omitting the other configurations.

The method of manufacturing a solid state imaging device in this embodiment will be described with respect to the light receiving area 11 and the pad area 12.

First, in the light receiving area 11, photodiodes as light receiving portions are formed on a principal surface side of a semiconductor substrate (not shown) by introducing, for example, ions of an n-type impurity such as phosphorus into, for example, a p-type silicon substrate by such as ion implantation. Then, a channel stop, transfer channels and the like are formed similarly by introducing n-type or p-type impurity ions.

Figure 3A:
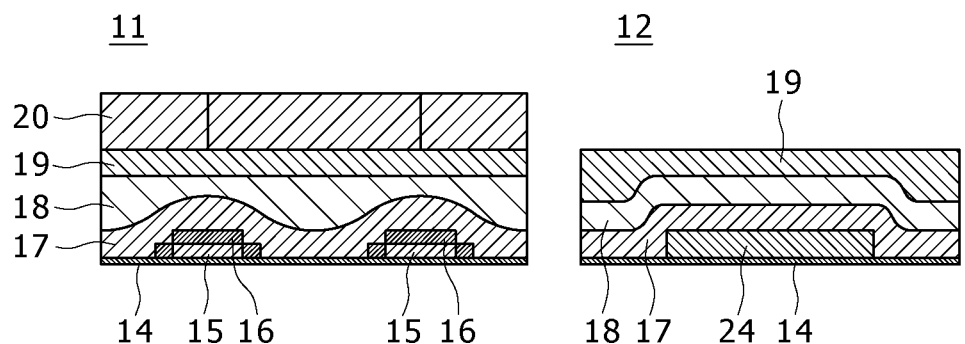

Next, as shown in FIG. 3A, in the light receiving area 11, transfer electrodes 15, an interlayer dielectric layer 17, a passivation layer 18, a planarizing layer 19 and color filters 20 are formed over the semiconductor substrate in which the above-mentioned elements have been formed. Besides, in the pad area 12, pad portions 24, the interlayer dielectric layer 17, the passivation layer 18 and the planarizing layer 19 are formed.

First, an insulating layer 14 is formed on the above-mentioned semiconductor substrate by a thermal oxidation method or the like. Then, a polysilicon layer or the like is formed on the insulating layer 14 by CVD (Chemical Vapor Deposition) or the like, and the polysilicon layer or the like is selectively etched into a predetermined pattern by dry etching or the like, to form the transfer electrodes 15. Further, an insulating layer is formed so as to cover the upper surfaces and side surfaces of the transfer electrodes 15 by a thermal oxidation method or the like.

Subsequently, a metallic film of tungsten or the like is formed so as to cover the whole surface of the semiconductor substrate, and a light-blocking film 16 covering the transfer electrodes 15 is formed by photolithography and anisotropic dry etching or the like.

Besides, in the pad area 12, an aluminum layer is formed at predetermined positions on the insulating layer 14 by sputtering or the like, and photolithography is carried out, to form aluminum electrodes as the pad portions 24.

Further, the interlayer dielectric layer 17 is formed to cover the whole surface of the semiconductor substrate. The interlayer dielectric layer 17 is formed over the whole surface of the semiconductor substrate so as to cover both the light receiving area 11 and the pad area 12. Then, for example, an acrylic resin, a polyimide resin, an isocyanate resin or the like is applied onto the interlayer insulating layer 17 by spin coating or the like, to form the passivation layer 18. Subsequently, the planarizing layer 19 for planarization is formed on the passivation layer 18.

Furthermore, in the light receiving area 11, the color filters 20 corresponding to the light receiving portions are formed on the planarizing layer 19.

Figure 3B:
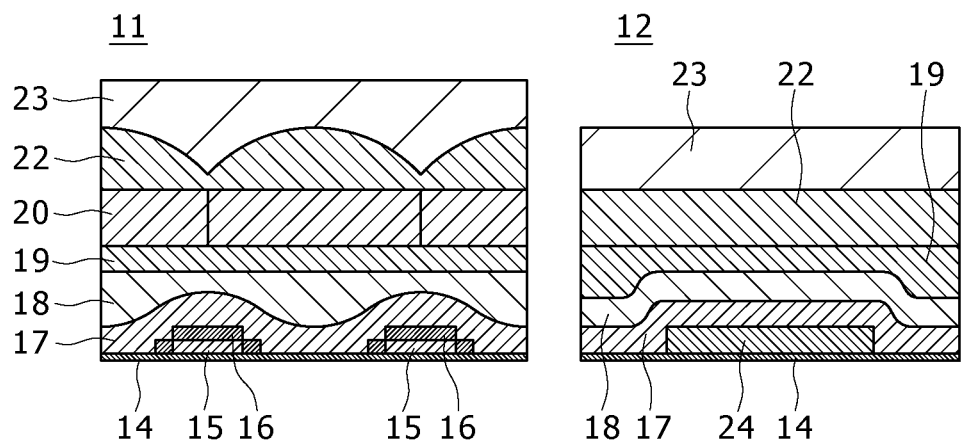

Next, as shown in FIG. 3B, a microlens material layer 22 is formed on the color filters 20 in the light receiving area 11 and on the planarizing layer 19 in the pad area 12 by use of a polystyrene resin or the like. Then, in the light receiving area 11, the microlens material layer 22 is processed into the shape of microlenses corresponding to the light receiving portions, by a known method.

Further, a fluorine-containing low-reflection film of fluorine-containing siloxane or the like or a low-reflection inorganic film of an LTO (Low Temperature Oxide) or the like is formed as the low-reflection material layer 23, on the microlens material layer 22 in both the light receiving area 11 and the pad area 12.

Figure 3C:
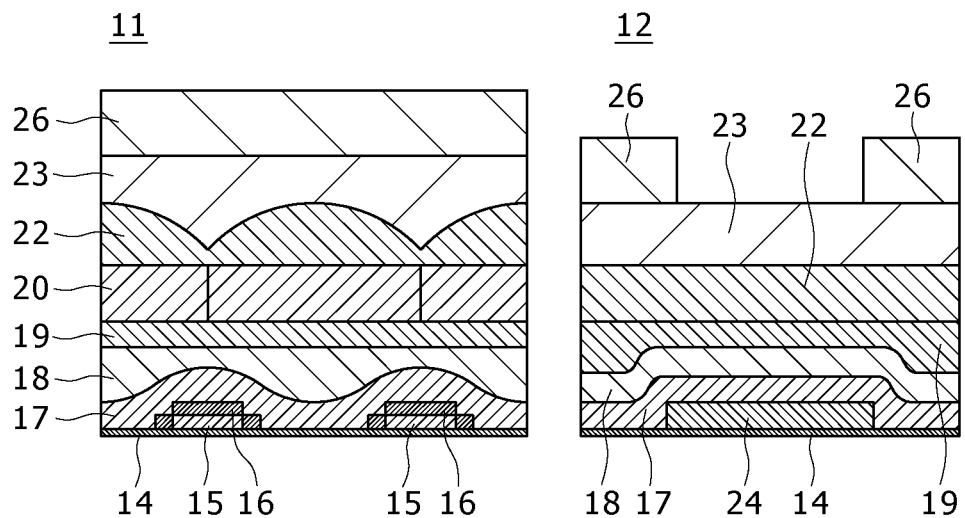

Subsequently, processing for forming openings over the pad portions 24 in the pad area 12 is conducted. First, as shown in FIG. 3C, a resist pattern 26 corresponding to the pad portions 24 is formed from a photoresist by photolithography.

Then, as shown in FIG. 3D, the interlayer dielectric layer 17, the passivation layer 18, the planarizing layer 19, the microlens material layer 22 and the low-reflection material layer 23 on the upper side of the pad portions 24 are etched by dry etching in which the resist pattern 26 is used as a mask. By this step, the openings 25 are formed on the upper side of the pad portions 24.

Next, the resist pattern 26 is removed. Thereafter, as shown in FIG. 3E, the whole surface of the semiconductor substrate, that is, the surface of the low-reflection material layer 23 in the light receiving area 11 as well as the surface of the low-reflection material layer 23 and the side walls of the openings 25 in the pad area 12 is subjected to a hydrophilic treatment.

In this embodiment, the hydrophilic treatment of the semiconductor substrate is carried out by a normal temperature oxygen radical treatment.

An example of conditions in which to carry out the hydrophilic treatment by the normal temperature oxygen radical treatment is shown below.
[Apparatus]
While using a microwave-excited type plasma system, a punching metal is disposed between the system and the semiconductor substrate to be subjected to the hydrophilic treatment. By the punching metal, charged particles are substantially blocked, so that radicals are permitted to go toward the semiconductor substrate.
[Conditions]
Oxygen flow rate: 1000 ccm
Microwave power: 1500 W
Pressure: 100 Pa
Wafer stage temperature: 25 to 35° C.
Treatment time: 60 sec In the normal temperature oxygen radical treatment, the surface treatment applied to the semiconductor substrate is a radical treatment and the treating temperature is normal temperature, so that it is possible to restrain damages to organic material layers or resin material layers such as the microlens material layer 22 and, hence, to restrain a lowering in layer thickness and recession of the side walls in the openings 25. For instance, where the pad portions 24 are 100 μm in thickness and the microlens material layer 22 and the low-reflection material layer 23 are 1 to 2 μm in thickness, the loss of the resin material layer constituting the microlens material layer 26 is as small as 7 nm. Therefore, at the side walls in the openings 25, the microlens material layer 22 recedes little. In addition, where the planarizing layer 19 and the passivation layer 18 are formed of an organic material or resin material like the microlens material layer 22, also, it is possible to restrain damages to these layers due to the hydrophilic treatment and to restrain recession of these layers at the side walls in the openings 25.

Figure 4A:
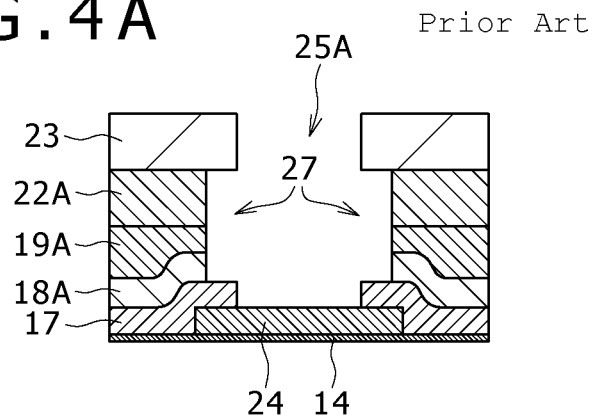
FIGS. 4A and 4B show manufacturing step diagrams of a solid state imaging device according to the related art.

On the other hand, where the hydrophilic treatment is carried out, for example, by an oxygen plasma treatment according to the related art, as shown in FIG. 4A, the microlens material layer 22A would recede from the side walls in the openings 25A. For example, where the pad portions 24 are 100 μm in thickness and the microlens material layer 22A and the low-reflection material layer 23 are 1 to 2 μm in thickness, the loss of the resin material layer constituting the microlens material layer 22A is 100 nm or more. Besides, where the planarizing layer 19A and the passivation layer 18A are formed of an organic material or resin material, these layers recede at the side walls in the openings 25A by an amount of 100 nm or more, like the microlens material layer 22A.

Figure 4B:
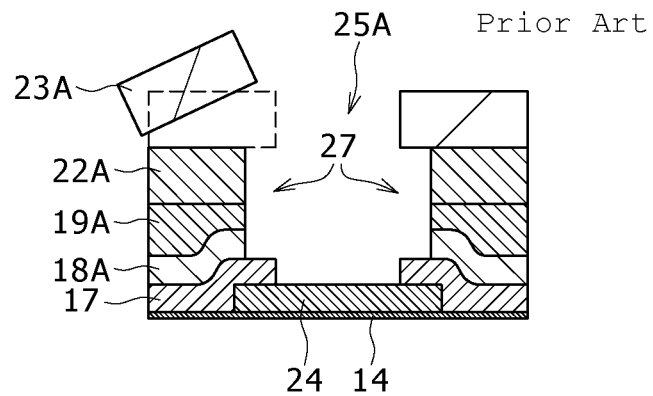

Due to the recession of these layers, recession portions 27 are generated at the side walls of the openings 25A. In addition, the recession of the microlens material layer 22A leads to an overhang structure of the low-reflection material layer 23 at the upper side of the openings 25A. This would cause exfoliation of the low-reflection material layer 23, as the low-reflection material layer 23A shown in FIG. 4B, during assembly steps, for example, at the time of a BGR tape peeling step.

Incidentally, the system to be used for the normal temperature oxygen radical treatment is not limited to the above-mentioned microwave-excited type plasma system, and other systems may also be used. Examples of the system which can be used include high-density plasma systems such as a parallel plate RIE plasma system, a high-pressure narrow-gap plasma system, an ECR plasma system, a transformer-coupled plasma system, an induction-coupled plasma system, a chemical dry type radical generation system, an ozone generation ashing system, and a helicon wave plasma system. In using such a system, also, a punching metal may be disposed between the high-density plasma system and the semiconductor substrate to be subjected to the hydrophilic treatment, whereby the hydrophilic treatment can be carried out by the normal temperature oxygen radical treatment in the above-mentioned manner.

The gas species is not limited to $O_2$, and a flon gas such as $C_2F_6$, $C_3F_8$, $C_4F_8$, $CH_2F_2$, $CHF_3$, etc. may be added to $O_2$; further, such a gas may be used with Ar, He, or $N_2$ gas added thereto.

In addition, the above-mentioned normal temperature oxygen radical treatment may be carried out continuously to and immediately upon a treatment for peeling the resist pattern 26, after the step of forming the openings shown in FIG. 3D.

By the above-mentioned steps, the solid state imaging device can be manufactured in which the surface of the low-reflection material layer 23 in the light receiving area 11 and the pad area 12 has been treated to be hydrophilic and, also, the inside of the openings 25 in the pad area 12 has been treated to be hydrophilic, as shown in FIG. 3F.

Further, the semiconductor substrate having undergone the hydrophilic treatment is diced, like in the related art. For instance, while supplying pure water from the vicinity of a dicing blade, cutting grooves are formed by the dicing blade. In this case, cutting chips are generated from the vicinity of the cutting grooves formed along the locus of the dicing blade, but the cutting chips are washed away in the direction of the circumferential edge of the semiconductor substrate, together with the flow of the pure water. In this instance, the surface of the low-reflection material layer formed at the surface layer of the solid state imaging device has been made hydrophilic. Besides, the side walls in the pad openings have been made hydrophilic. Further, no part of the side walls in the openings has receded. In other words, high hydrophilicity has been obtained at the surface of the semiconductor substrate. Therefore, a layer of the pure water supplied to the surface of the semiconductor substrate spreads uniformly, not generating any dry area. Further, deposition of the cutting chips in, for example, recession area in the openings is obviated. Accordingly, deposition of cutting chips on the surface of the semiconductor substrate in the dicing step can be prevented from occurring.

Incidentally, after the microlenses corresponding to the light receiving portions in the light receiving area 11 are formed, in the step shown in FIG. 3B in the above-mentioned manufacturing method, the surface of the microlens material layer 22 is preferably made hydrophilic by the normal temperature oxygen radical treatment.

After the microlenses are formed in the light receiving area 11, the low-reflection material layer 23 is formed on the surface of the microlens material layer 22 by, for example, spin coating conducted using a solution of a resin material, for example. In this case, with the surface of the microlens material layer 22 preliminarily treated to be hydrophilic, wettability of the surface with the solution is enhanced. Therefore, formation of the low-reflection material layer 23 is facilitated.

With the hydrophilic treatment carried out by the normal temperature oxygen radical treatment, it is possible to restrain a reduction in layer thickness and a shape change of the microlenses which might arise from damages to the organic material constituting the microlens material layer 22, as compared with the case of the oxygen plasma treatment according to the related art. This restraining effect is like that on the microlens material layer exposed in the openings in the pad area. Accordingly, the solid state imaging device can be manufactured while preventing device characteristics such as sensitivity, shading and smear characteristics from being lowered due to shape change of microlenses.

As has been described above, according to the method of manufacturing a solid state imaging device in this embodiment, the surface of the semiconductor substrate is subjected to the normal temperature oxygen radical treatment, whereby the surface can be made hydrophilic without damaging the organic material layers such as the passivation layer and the microlens material layer at the side walls of the openings. Since the organic material layers are not damaged, recession of the side walls of the openings can be prevented from occurring, and the low-reflection material layer can be prevented from overhanging at the upper side of the openings. Accordingly, it is possible to restrain exfoliation of the low-reflection material layer during assembly steps, for example, at the time of a BGR tape peeling step.

<3. A Configuration Example of an Electronic Apparatus>

The solid state imaging device according to an embodiment of the present invention is applicable to electronic apparatuses such as a camera having a solid state imaging device, a mobile apparatus equipped with a camera, and other apparatus having a solid state imaging device.

Figure 5:
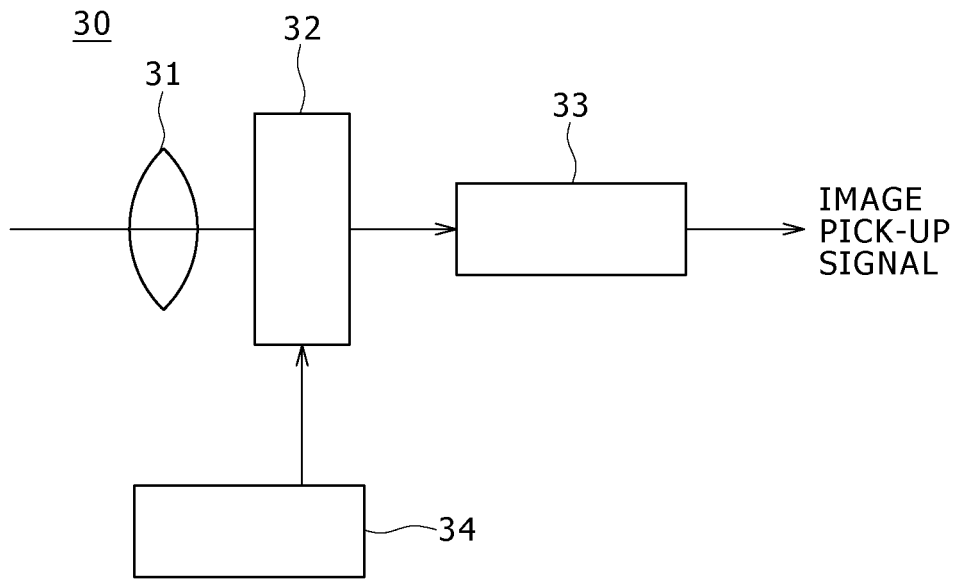
FIG. 5 is a block diagram of an electronic apparatus according to yet another embodiment of the invention.

FIG. 5 shows a block diagram of a configuration in which the solid state imaging device is applied to a digital still camera capable of still photography, as an example of the electronic apparatus according to an embodiment of the present invention.

The camera 30 according to this embodiment includes an optical system (optical lens) 31, a solid state imaging device 32, a signal processing circuit 33, and a driving circuit 34.

As the solid state imaging device 32, the above-described solid state imaging device is applied. The optical lens 31 focuses image light (incident light) coming from a subject, to form an image on an imaging plane in the solid state imaging device 32. As a result, signal charges are stored for a predetermined period in photoelectric conversion elements in the solid state imaging device 32. The driving circuit 34 supplies a transfer operation signal for the solid state imaging device 32. According to a driving signal (timing signal) supplied from the driving circuit 34, signal transfer in the solid state imaging device 32 is conducted. The signal processing circuit 33 applies various signal processings to an output signal from the solid state imaging device 32. A picture signal obtained upon the signal processings is stored in a storage medium such as a memory, or is outputted to a monitor or the like. The camera 30 in this embodiment includes a camera module in which the optical lens 31, the solid state imaging device 32, the signal processing circuit 33, and the driving circuit 34 are combined together into a module.

The present invention makes it possible to configure the camera as shown in FIG. 5, a mobile apparatus equipped with a camera, represented by a cellular phone equipped with a camera module, and the like.

Furthermore, the configuration shown in FIG. 5 can be configured as a module having an imaging function in which the optical lens 31, the solid state imaging device 32, the signal processing circuit 33, and the driving circuit 34 are combined together into a module, that is, a so-called imaging function module. The present invention makes it possible to configure an electronic apparatus having such an imaging function module.

While the CCD image sensor has been described as an example of the solid state imaging apparatus in the embodiment above, other image sensors than the CCD image sensor, such as a CMOS (Complementary Metal Oxide Semiconductor) image sensor, may also be applied as the solid state imaging apparatus.

The present invention is not limited to the configurations described in the embodiments above, and various modifications are possible within the scope of the invention.

What is claimed is:

1. A solid state imaging device comprising:
   a semiconductor substrate;

a light receiving portion formed in the semiconductor substrate;

a pad portion formed over the semiconductor substrate;

a microlens material layer formed over the light receiving portion and the pad portion;

a low-reflection material layer that is one of a fluorine-containing film and an inorganic low temperature oxide film, which is formed on the microlens material layer and a surface of which is hydrophilic; and an opening formed in the microlens material layer and the low-reflection material layer on the upper side of the pad portion;

wherein side walls of the opening are hydrophilic, and the microlens material layer exposed from the side walls of the opening does not show recession relative to the low-reflection material layer.

2. The solid state imaging device according to claim 1, wherein the low-reflection material layer and the side walls of the opening are made hydrophilic by a normal temperature oxygen radical treatment having a wafer stage temperature of 25 to 35 degrees C.

3. The solid state imaging device according to claim 2, wherein an upper surface of the microlens layer is treated to be hydrophilic.

4. An electronic apparatus comprising:
a solid state imaging device including
a semiconductor substrate,
a light receiving portion formed in the semiconductor substrate,
a pad portion formed over the semiconductor substrate,
a microlens material layer formed over the light receiving portion and the pad portion,
a low-reflection material layer that is one of a fluorine-containing film and an inorganic low temperature oxide film, which is formed on the microlens material layer and a surface of which is hydrophilic, and
an opening formed in the microlens material layer and the low-reflection material layer on the upper side of the pad layer,
side walls of the opening being hydrophilic, and the microlens material layer exposed from the side walls of the opening does not show recession relative to the low-reflection material layer;
an optical system operable to guide incident light to an imaging portion of the solid state imaging device; and
a signal processing circuit operable to process an output signal from the solid state imaging device.

5. The solid state imaging device according to claim 1, wherein the low-reflection material layer is a fluorine-containing siloxane.

6. The solid state imaging device according to claim 1, wherein the pad portion has a thickness of 100 μm, and the microlens material layer and the low-reflection material layer each have a thickness of about 1 μm to 2 μm.

* * * * *